(12) United States Patent
Hsieh et al.

(10) Patent No.: US 11,768,235 B2
(45) Date of Patent: Sep. 26, 2023

(54) TEST CIRCUIT AND METHOD

(71) Applicant: TAIWAN SEMICONDUCTOR MANUFACTURING COMPANY, LTD., Hsinchu (TW)

(72) Inventors: Hsieh-Hung Hsieh, Hsinchu (TW); Yen-Jen Chen, Hsinchu (TW); Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/151,959

(22) Filed: Jan. 9, 2023

(65) Prior Publication Data
US 2023/0160954 A1    May 25, 2023

Related U.S. Application Data

(63) Continuation of application No. 17/376,338, filed on Jul. 15, 2021, now Pat. No. 11,555,848, which is a continuation of application No. 16/845,515, filed on Apr. 10, 2020, now Pat. No. 11,079,428.

(60) Provisional application No. 62/948,014, filed on Dec. 13, 2019.

(51) Int. Cl.
G01R 31/28    (2006.01)

(52) U.S. Cl.
CPC ..... G01R 31/2884 (2013.01); G01R 31/2853 (2013.01); G01R 31/2879 (2013.01)

(58) Field of Classification Search
CPC ............ G01R 31/2884; G01R 31/2879; G01R 31/2853

USPC .................... 324/750.01, 537, 500
See application file for complete search history.

(56) References Cited

U.S. PATENT DOCUMENTS

| | | | |
|---|---|---|---|
| 7,126,359 B2 | 10/2006 | Huang et al. | |
| 7,253,436 B2 * | 8/2007 | Matsumoto | G01R 31/2884 257/E21.524 |
| 2006/0061368 A1 | 3/2006 | Furse et al. | |
| 2012/0125102 A1 | 5/2012 | Hattori et al. | |
| 2013/0182753 A1 | 7/2013 | Delforce et al. | |
| 2014/0266308 A1 | 9/2014 | Goltman et al. | |
| 2015/0309545 A1 | 10/2015 | Shuey | |
| 2018/0024158 A1 | 1/2018 | Sugiyama et al. | |

(Continued)

OTHER PUBLICATIONS

Sia, Choon Beng et al., "Novel RF Process Monitoring Test Structure for Silicon Devices", IEEE Transactions on Semiconductor Manufacturing, vol. 18, No. 2, May 2005, pp. 246-254.

(Continued)

*Primary Examiner* — Giovanni Astacio-Oquendo
(74) *Attorney, Agent, or Firm* — Hauptman Ham, LLP

(57) ABSTRACT

An IC includes a plurality of pads at a top surface of a semiconductor wafer, an amplifier configured to receive a first AC signal at an input terminal, and output a second AC signal at an output terminal, a first detection circuit coupled to the input terminal and configured to output a first DC voltage to a first pad of the plurality of pads responsive to the first AC signal, and a second detection circuit coupled to the output terminal and configured to output a second DC voltage to a second pad of the plurality of pads responsive to the second AC signal.

20 Claims, 8 Drawing Sheets

(56) References Cited

U.S. PATENT DOCUMENTS

2019/0353697 A1* 11/2019 Kesselring ............ H01L 23/585
2021/0181251 A1* 6/2021 Hsieh ................. G01R 31/2884

OTHER PUBLICATIONS

Cho, Ming-Hsiang et al., "Miniature RF Test Structure for On-Wafer Device Testing and In-Line Process Monitoring", EEE Transactions on Electron Devices, vol. 55, No. 1, Jan. 2008, pp. 462-465.

* cited by examiner

TEST CIRCUIT AND METHOD

PRIORITY CLAIM

The present application is a continuation of U.S. application Ser. No. 17/376,338, filed Jul. 15, 2021, which is a continuation of U.S. application Ser. No. 16/845,515, filed Apr. 10, 2020, now U.S. Pat. No. 11,079,428, issued Aug. 3, 2021, which claims the priority of U.S. Provisional Application No. 62/948,014, filed Dec. 13, 2019, each of which is incorporated herein by reference in its entirety.

BACKGROUND

Integrated circuits (ICs) often include circuits that generate alternating current (AC) signals and perform various functions involving the generated AC signals. AC signals have frequency values ranging from less than one megahertz (MHz) to those corresponding to millimeter (mm) wavelengths. Properties of the circuits used to generate and perform functions on the AC signals are sometimes susceptible to manufacturing process variations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
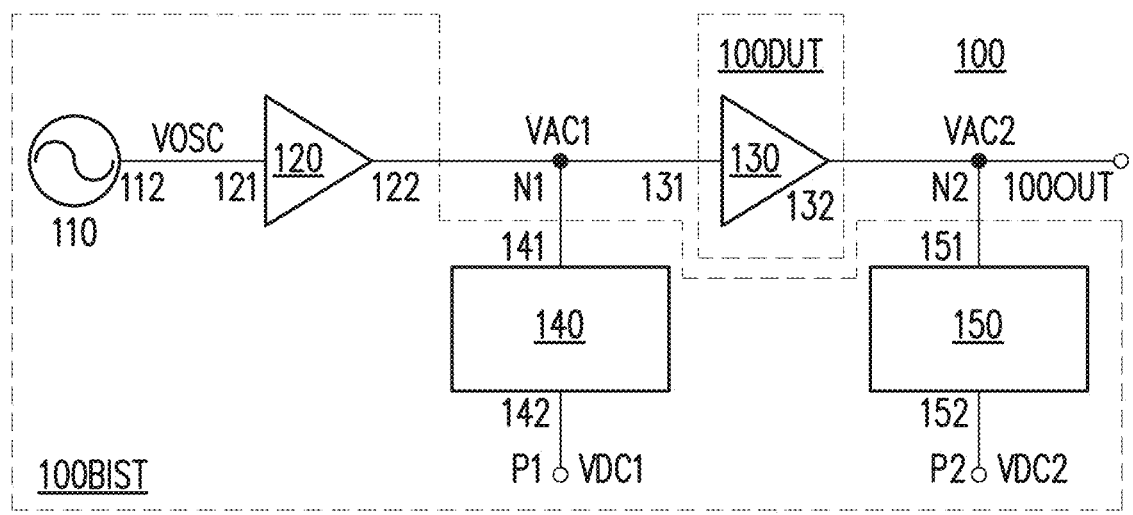
FIGS. 1A and 1B are schematic diagrams of a test circuit, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a test circuit includes an oscillator configured to generate an AC signal, an amplifier configured to output an amplified AC signal based on the AC signal, and first and second detection circuits. In operation, the first detection circuit generates a first direct current (DC) voltage having a first value based on an amplitude of the AC signal, and the second detection circuit generates a second DC voltage having a second value based on an amplitude of the amplified AC signal. The test circuit is configured to provide electrical accessibility to the first and second DC voltages in a DC test operation, e.g., wafer acceptance testing (WAT), and the first and second values are usable to calculate a gain of the amplifier. The test circuit thereby enables AC amplifier performance data to be obtained using DC test pads and equipment, which are smaller and less complicated, respectively, than AC test pads and equipment, and without requiring an AC test operation separate from a DC test operation.

Figure 1B:
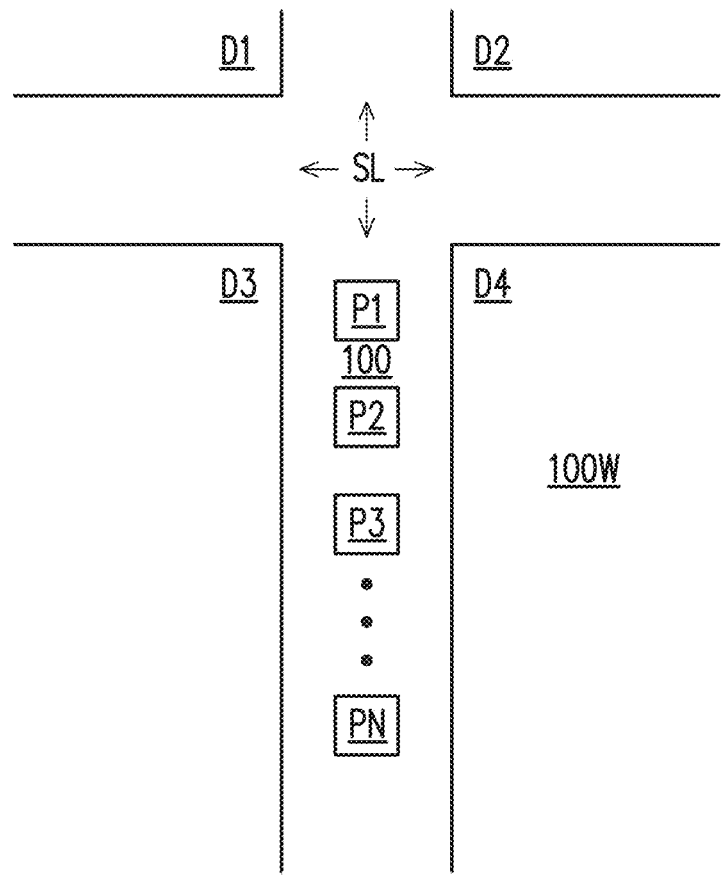

FIGS. 1A and 1B are schematic diagrams of a test circuit 100, in accordance with some embodiments. FIG. 1A is a block diagram of test circuit 100 and FIG. 1B is a plan view of a semiconductor wafer 100W including test circuit 100, in accordance with some embodiments.

Test circuit 100 is an IC that includes an oscillator 110, an isolation circuit 120, an amplifier 130, a first detection circuit 140, and a second detection circuit 150. Oscillator 110 includes an output terminal 112 coupled to an input terminal 121 of isolation circuit 120, and isolation circuit 120 includes an output terminal 122 coupled to a node N1. In some embodiments, test circuit 100 does not include isolation circuit 120, and output terminal 112 is coupled to node N1.

Amplifier 130 includes an input terminal 131 coupled to node N1, and an output terminal 132 coupled to a node N2 and to an output terminal 100OUT. Detection circuit 140 includes an input terminal 141 coupled to node N1, and an output terminal 142 coupled to a pad P1. Detection circuit 150 includes an input terminal 151 coupled to node N2, and an output terminal 152 coupled to a pad P2.

Two or more circuit elements are considered to be coupled based on a direct electrical connection or an electrical connection that includes one or more additional circuit elements, e.g., one or more logic or transmission gates, and is thereby capable of being controlled, e.g., made resistive or open by a transistor or other switching device.

Test circuit 100 also includes two or more input terminals (not shown) configured to receive one or more voltage levels, e.g., a power supply voltage level VDD, and a reference voltage level, e.g., a ground voltage level or power supply reference level VSS. In some embodiments power supply voltage level VDD represents an operating voltage level, relative to power supply reference level VSS, of amplifier 130, and each of the one or more voltage levels has a value, relative to power supply reference level VSS, less than or equal to power supply voltage level VDD. Each of oscillator 110, isolation circuit 120, amplifier 130, and first and second detection circuits 140 and 150 includes one or more nodes (not shown in FIGS. 1A and 1B) configured to carry the one or more voltage levels and/or the reference voltage level.

Oscillator 110 is an electronic circuit configured to receive the one or more voltage levels and the reference voltage level, and generate an oscillation signal VOSC on output terminal 112 in response to the one or more voltage levels and the reference voltage level. Oscillation signal VOSC is an AC signal having a frequency ranging from about 10 megahertz (MHz) to about 100 gigahertz (GHz). In some embodiments, oscillator 110 is configured to generate oscillation signal VOSC having a frequency ranging from 1 GHz to 10 GHz. In some embodiments, oscillator 110 is configured to generate oscillation signal VOSC having a frequency ranging from 24 GHz to 100 GHz. In some embodiments, an AC signal, e.g., oscillation signal VOSC, is referred to as a radio frequency (RF) signal. In some embodiments, an AC signal, e.g., oscillation signal VOSC, having the frequency ranging from 24 GHz to 100 GHz is referred to as a mmWave signal.

In various embodiments, oscillator 110 is configured to generate oscillation signal VOSC having a single predetermined frequency or having one of multiple predetermined frequencies selectable responsive to the one or more voltage levels and the reference voltage level.

In various embodiments, oscillator 110 includes one or more of a ring oscillator, a feedback oscillator, a differential oscillator, or other circuit suitable for generating oscillation signal VOSC. In various embodiments, oscillator 110 includes an oscillator 200A discussed below with respect to FIG. 2A or an oscillator 200B discussed below with respect to FIG. 2B.

Isolation circuit 120 is an electronic circuit configured to receive oscillation signal VOSC at input terminal 121 and, responsive to oscillation signal VOSC and one or more of the one or more voltage levels and/or the reference voltage level, generate an AC signal VAC1 on output terminal 122, and thereby on node N1, having a same frequency as oscillation signal VOSC.

Isolation circuit 120 is configured to isolate oscillator 110 from loading effects from one or both of input terminal 131 of amplifier 130 being coupled to node N1 or input terminal 141 of detection circuit 140 being coupled to node N1, and/or to isolate amplifier 130 and/or detection circuit 140 from one or more frequency components of oscillation signal VOSC. In various embodiments, isolation circuit 120 includes one or more of a buffer, an inverter, a filter, or other circuit suitable for isolating oscillator 110 from loading effects and/or isolating amplifier 130 and/or detection circuit 140 from one or more frequency components of oscillation signal VOSC. In various embodiments, isolation circuit 120 includes an isolation circuit 300A discussed below with respect to FIG. 3A or an isolation circuit 300B discussed below with respect to FIG. 3B.

In some embodiments in which test circuit 100 does not include isolation circuit 120, oscillator 110 is configured to generate oscillation signal VOSC as AC signal VAC1 on node N1. In some embodiments, isolation circuit 120 is integrated with oscillator 110, and oscillator 110 is thereby configured to generate AC signal VAC1 on node N1. In some embodiments, test circuit 100 does not include oscillator 110, and isolation circuit 120 is configured to receive oscillation signal VOSC from a circuit (not shown) external to test circuit 100. In some embodiments, test circuit 100 does not include oscillator 110 or isolation circuit 120, and is configured to receive AC signal VAC1 on node N1 from a circuit (not shown) external to test circuit 100.

Amplifier 130 is an electronic circuit configured to receive AC signal VAC1 at input terminal 131 and, responsive to AC signal VAC1 and the one or more voltage levels and the reference voltage level, generate an AC signal VAC2 on output terminal 132, and thereby on node N2. Amplifier 130 is configured to control an amplitude of AC signal VAC2 relative to an amplitude of AC signal VAC1, otherwise referred to as a gain of amplifier 130, to have at least one predetermined target gain value. In some embodiments, the gain of amplifier 130 is a ratio of the amplitude of AC signal VAC2 to the amplitude of AC signal VAC1. In various embodiments, the at least one predetermined target gain value includes a value greater than, less than, or equal to one.

In various embodiments, amplifier 130 is configured to generate AC signal VAC2 responsive to AC signal VAC1 having a single predetermined target gain value or having one of multiple predetermined target gain values selectable responsive to the one or more voltage levels and the reference voltage level.

In various embodiments, amplifier 130 includes a push-pull configuration, a common-source configuration, or other arrangement suitable for controlling an AC signal gain. In various embodiments, amplifier 130 includes an amplifier 400A discussed below with respect to FIG. 4A or an amplifier 400B discussed below with respect to FIG. 4B.

Each of detection circuits 140 and 150 is an electronic circuit configured to receive respective AC signal VAC1 or VAC2 at the corresponding input terminal 141 or 151 and, responsive to the corresponding AC signal VAC1 or VAC2 and the one or more voltage levels and the reference voltage level, generate a corresponding DC signal VDC1 on output terminal 142, and thereby on pad P1, or DC signal VDC2 on output terminal 152, and thereby on pad P2. Detection circuit 140 is configured to generate DC signal VDC1 having an amplitude that varies in response to variations in the amplitude of AC signal VAC1, and detection circuit 150 is configured to generate DC signal VDC2 having an amplitude that varies in response to variations in the amplitude of AC signal VAC2.

In various embodiments, detection circuit 140 is configured to respond to an AC signal VAC1 amplitude increase by either increasing or decreasing the DC signal VDC1 amplitude, and detection circuit 150 is configured to respond to an AC signal VAC2 amplitude increase by either increasing or decreasing the DC signal VDC2 amplitude.

In various embodiments, detection circuits 140 and 150 have a same configuration or different configurations. In various embodiments, one or both of detection circuit 140 or 150 includes one or more gain stages, one or more low-pass filters, or other arrangement suitable for representing an AC signal amplitude with a DC signal amplitude. In various embodiments, one or both of detection circuit 140 or 150 includes a detection circuit 500 discussed below with respect to FIGS. 5A and 5B.

In the embodiment depicted in FIG. 1A, output terminal 100OUT is an open circuit such that detection circuit 150 is an entirety of a load at output terminal 132 of amplifier 130. In some embodiments, test circuit 100 includes a load circuit (not shown) coupled to output terminal 100OUT such that the load at output terminal 132 of amplifier 130 includes detection circuit 150 and the load circuit. In some embodiments, a load circuit (not shown) external to test circuit 100 is (not shown) coupled to output terminal 100OUT such that the load at output terminal 132 of amplifier 130 includes detection circuit 150 and the load circuit.

In the embodiment depicted in FIG. 1A, test circuit 100 includes oscillator 110, isolation circuit 120, and detection circuits 140 and 150 arranged as discussed above as a built-in self-test circuit (BIST) 100BIST configured to perform one or more test operations on a device-under-test (DUT) 100DUT including amplifier 130. In some embodiments, test circuit 100 and BIST 100BIST do not include one or both of oscillator 110 or isolation circuit 120 and are otherwise configured as discussed above to perform one or more test operations on DUT 100DUT.

Test circuit 100 including BIST 100BIST is thereby configured to, in operation, generate DC signals VDC1 and VDC2 having amplitudes usable to calculate a gain of amplifier 130 of DUT 100DUT. Test circuit 100 thereby enables AC amplifier performance data to be obtained using DC test pads and equipment, which are smaller and less complicated, respectively, than AC test pads and equipment, and without requiring an AC test operation separate from a DC test operation.

FIG. 1B depicts an embodiment in which test circuit 100 is electrically accessible through pads P1-PN located at a top surface of semiconductor wafer 100W. In addition to semiconductor wafer 100W including pads P1-PN of test circuit 100, FIG. 1B depicts product dies D1-D4 and scribe lines SL between corresponding pairs of product dies D1-D4.

Scribe lines SL correspond to portions of semiconductor wafer 100W between the product dies, e.g., product dies D1-D4, at which semiconductor wafer 100W is cut during a die separation process. In some embodiments, scribe lines SL have a width ranging from 80 micrometers (μm) to 120 μm.

Each of pads P1-PN is an exposed conductive layer, e.g., including aluminum, copper, and/or another suitable metal, configured to provide electrical accessibility, e.g., through a set of probe pins, to underlying IC elements, e.g., output terminals 142 and 152 of test circuit 100. In the embodiment depicted in FIG. 1B, each of pads P1-PN is electrically coupled to an element of test circuit 100. In some embodiments, one or more of pads P1-PN is electrically coupled to one or more elements other than elements of test circuit 100, e.g., one or more elements of a DC test structure or circuit (not shown).

Pads P1-PN have dimensions and spacing so as to be capable of inclusion in one or more scribe lines SL. In the embodiment depicted in FIG. 1B, pads P1-PN are arranged in a single column between product dies D3 and D4 have square shapes. In various embodiments, pads P1-PN are otherwise arranged and/or shaped so as to be capable of inclusion in one or more scribe lines SL. In some embodiments, pads P1-PN have square shapes with sides ranging from 20 μm to 80 μm. In some embodiments, pads P1-PN have square shapes with sides ranging from 30 μm to 50 μm.

In the embodiment depicted in FIG. 1A, test circuit 100 is configured to generate DC signal VDC1 on pad P1 and DC signal VDC2 on pad P2 as discussed above. In various embodiments, test circuit 100 is configured to generate one or both of DC signals on one or more pads other than respective pads P1 and P2. In various embodiments, test circuit 100 is configured to receive the one or more voltage levels and the reference voltage level on two or more of pads P1-PN, e.g., pads P3-PN. In some embodiments, pads P1-PN have a number N ranging from 4 to 48. In some embodiments, pads P1-PN have the number N ranging from 8 to 24.

In the embodiment depicted in FIG. 1B, an entirety of test circuit 100, including pads P1-PN, is located in the scribe line SL between product dies D3 and D4. In various embodiments, some or all of test circuit 100 is located outside of the scribe line SL in which pads P1-PN are located, e.g., in one or more adjacent scribe lines, product dies, or test dies such as a process-control-monitor (PCM) die. In some embodiments an entirety of test circuit 100, including pads P1-PN, is located in a test die, e.g., a PCM die.

By the configuration discussed above, e.g., the embodiment depicted in FIG. 1B, test circuit 100 provides electrical accessibility to DC signals VDC1 and VDC2 in a DC test, e.g., WAT, operation, such that the first and second values are usable to calculate a gain of amplifier 130 without requiring an AC test operation separate from a DC test operation.

Figure 2A:
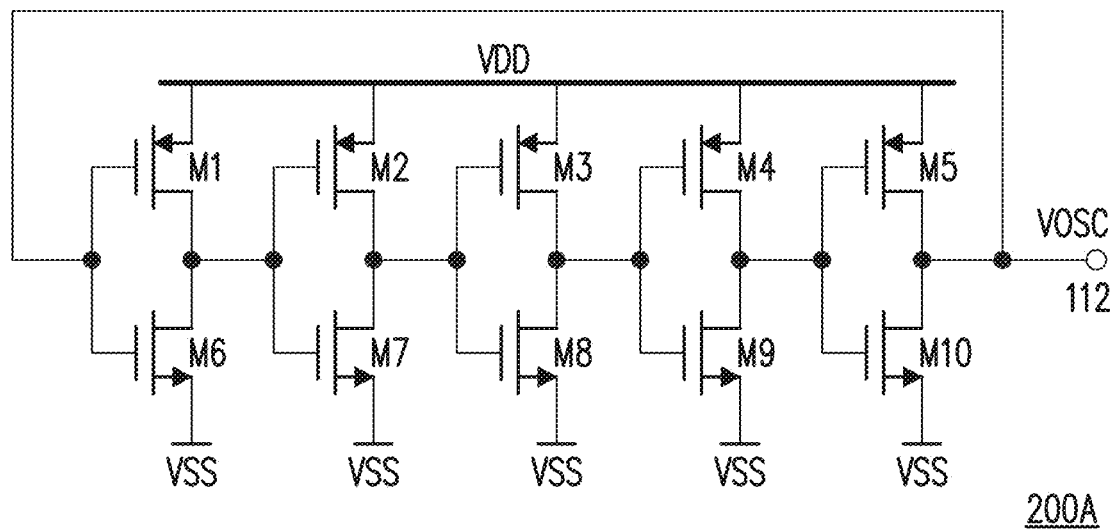
FIGS. 2A and 2B are schematic diagrams of oscillators, in accordance with some embodiments.
Figure 2B:
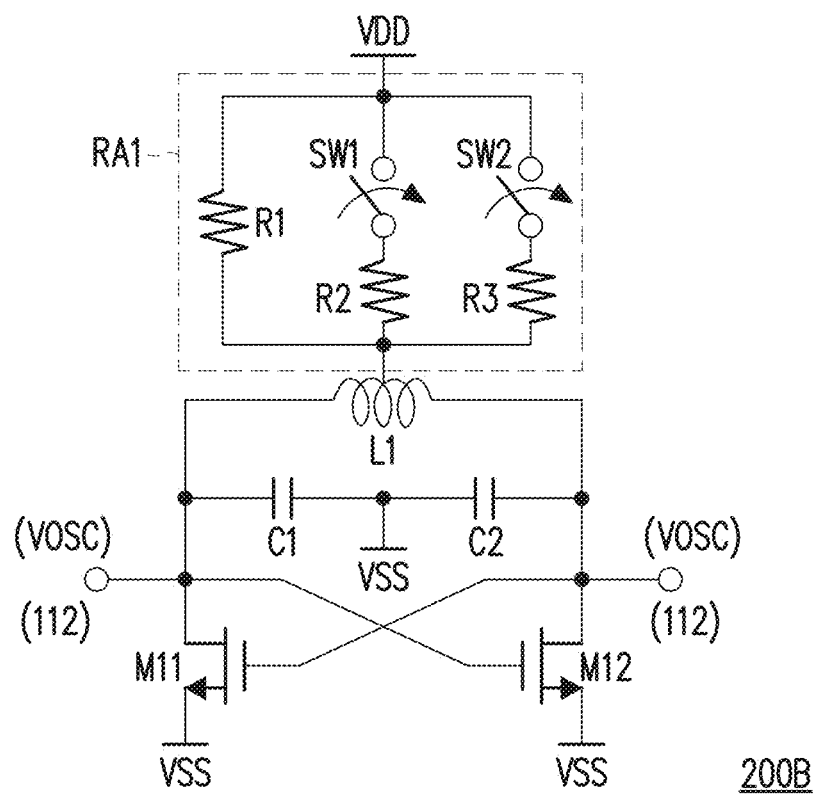

FIGS. 2A and 2B are schematic diagrams of respective oscillators 200A and 200B, in accordance with some embodiments. Each of oscillators 200A and 200B is usable as oscillator 110 discussed above with respect to FIGS. 1A and 1B.

Oscillator 200A includes output terminal 112 and nodes (not labeled) configured to carry power supply voltage level VDD and power supply reference level VSS, each discussed above with respect to FIGS. 1A and 1B, and PMOS transistors M1-M5 coupled in series with respective NMOS transistors M6-M10 between the power supply voltage level VDD and reference level VSS nodes. Gates and drain terminals of the transistors of each transistor pair M1/M6-M5/M10 are coupled together, the transistor pairs M1/M6-M5/M10 are coupled in series, and the drain terminals of the final transistor pair M5/M10 are coupled to the gates of the first transistor pair M1/M6 and to output terminal 112 discussed above with respect to FIGS. 1A and 1B. Oscillator 200A thereby includes transistors M1-M10 arranged as a ring oscillator configured to generate oscillation signal VOSC on output terminal 112, as discussed above with respect to FIGS. 1A and 1B.

Oscillator 200A is configured to generate oscillation signal VOSC having at least one frequency based on the ring oscillator configuration. In some embodiments, oscillator 200A is configured to generate oscillation signal VOSC having at least one frequency ranging from 1 GHz to 10 GHz.

In the embodiment depicted in FIG. 2A, oscillator 200A includes a total of five transistor pairs M1/M6-M5/M10. In various embodiments, oscillator 200A includes a total of fewer or greater than five transistor pairs. In some embodiments, oscillator 200A includes one or more switching devices (not shown), e.g., transistors, configured to switchably control the total number of transistor pairs included in the ring oscillator configuration, thereby switching between frequencies of oscillation signal VOSC, in operation. In some embodiments, control terminals, e.g., gates, of the one or more switching devices are coupled to one or more of pads P1-PN, discussed above with respect to FIGS. 1A and 1B, and oscillator 200A is thereby configured to control a frequency of oscillation signal VOSC responsive to one or more of the one or more voltage levels discussed above with respect to FIGS. 1A and 1B.

Oscillator 200B includes nodes (not labeled) configured to carry power supply voltage level VDD and power supply reference level VSS discussed above with respect to FIGS. 1A and 1B. Between the power supply voltage level VDD and reference level VSS nodes, oscillator 200B includes a switched resistor array RA1 coupled in series with an inductive device L1 and capacitive devices C1 and C2.

A transistor M11 is coupled in parallel with capacitive device C1, and a drain terminal of transistor M11 and terminals of each of inductive device L1 and capacitive device C1 are coupled together and to a first terminal usable as output terminal 112 discussed above with respect to FIGS. 1A and 1B. A transistor M12 is coupled in parallel with capacitive device C2, and a drain terminal of transistor M12 and terminals of each of inductive device L1 and capacitive device C2 are coupled together and to a second terminal usable as output terminal 112. A gate of transistor M12 is coupled to the first terminal, and a gate of transistor M11 is coupled to the second terminal, transistors M11 and M12 thereby being arranged in a cross-coupled configuration.

An inductive device, e.g., inductive device L1, is an IC structure configured to provide a targeted inductance value between two or more terminals. In various embodiments, an inductive device includes a single or multi-layer structure including one or more conductive, e.g., metallic, segments, having a geometry suitable for providing a targeted inductance value. In some embodiments, an inductive device includes a meander line or a transmission line. In some embodiments, an inductive device includes a meander line or a transmission line positioned in a scribe line, e.g., a scribe line SL discussed above with respect to FIGS. 1A and 1B.

A capacitive device, e.g., capacitive device C1 or C2, is an IC structure configured to provide a targeted capacitance value between two or more terminals. In various embodiments, a capacitive device includes a plate capacitor, e.g., a MIM capacitor, a capacitor-configured MOS device, a variable capacitor, an adjustable capacitor, e.g., a MOSCAP, or another IC device suitable for providing a targeted capacitance value.

In the embodiment depicted in FIG. 2B, each of transistors M11 and M12 is an NMOS transistor including a source terminal coupled to the power supply reference level VSS node. In some embodiments, each of transistors M11 and M12 is a PMOS transistor including a source terminal coupled to the power supply voltage level VDD node.

By the configuration discussed above oscillator 200B is arranged as an inductor-capacitor (LC) resonator, including inductive device L1 and capacitive devices C1 and C2, in cooperation with the cross-coupled pair of transistors M11 and M12. Oscillator 200B is thereby configured to generate a differential AC signal (not labeled) at the first and second terminals, either of which is usable as output terminal 112 with the corresponding portion of the differential AC signal relative to power supply reference level VSS being usable as oscillation signal VOSC.

Oscillator 200B is thereby configured to generate oscillation signal VOSC having a frequency based on the targeted inductance value of inductive device L1 and the targeted capacitance values of capacitive devices C1 and C2. In some embodiments, oscillator 200B is configured to generate oscillation signal VOSC having a frequency ranging from 24 GHz to 100 GHz.

Switched resistor array RA1 includes resistive devices R1, R2, and R3, and switching devices SW1 and SW2 coupled in series with respective resistive devices R2 and R3. Resistive device R1 is configured in parallel with the series of switching device SW1 and resistive device R2, and in parallel with the series of switching device SW2 and resistive device R3.

A resistive device, e.g., resistive device R1, R2, or R3, is an IC structure configured to provide a targeted resistance value between two or more terminals. In various embodiments, a resistive device includes a single or multi-layer structure including one or more conductive, e.g., metallic, segments, having a geometry suitable for providing a targeted resistive value.

In the embodiment depicted in FIG. 2B, switched resistor array RA1 includes a total of two switching devices SW1 and SW2 coupled in series with resistive devices R2 and R3. In various embodiments, switched resistor array RA1 includes a total of fewer or greater than two switching devices coupled in series with resistive devices.

In the embodiment depicted in FIG. 2B, switched resistor array RA1 is coupled between the power supply voltage level VDD node and inductive device L1. In some embodiments, e.g., embodiments in which oscillator 200B incudes transistors M11 and M12 as PMOS transistors, switched resistor array RA1 is coupled between inductive device L1 and the power supply reference level VSS node.

Switched resistor array RA1 is thereby configured to, in operation, control current flow to the LC resonator including inductive device L1 and capacitive devices C1 and C2, and cross-coupled transistors M11 and M12, such that the current is within a range within which oscillation occurs. By being configured to control current flow as discussed above, switched resistor array RA1 enables tuning of oscillator 200B to address manufacturing process variations, in operation.

In some embodiments, control terminals of switching devices SW1 and SW2 are coupled to circuit elements (not shown), e.g., non-volatile memory cells, and switching devices SW1 and SW2 are thereby configured to be switched on or off responsive to a predetermined combination of power supply voltage level VDD and power supply reference level VSS, in operation. In some embodiments, control terminals of the switching devices, e.g., switching devices SW1 and SW2, are coupled to a subset of pads P1-PN and the switching devices are thereby configured to be switched on or off responsive to the one or more voltage levels discussed above with respect to FIGS. 1A and 1B.

By including one of oscillators 200A or 200B configured to generate oscillation signal VOSC, test circuit 100 is capable of realizing the benefits discussed above with respect to FIGS. 1A and 1B.

Figure 3A:
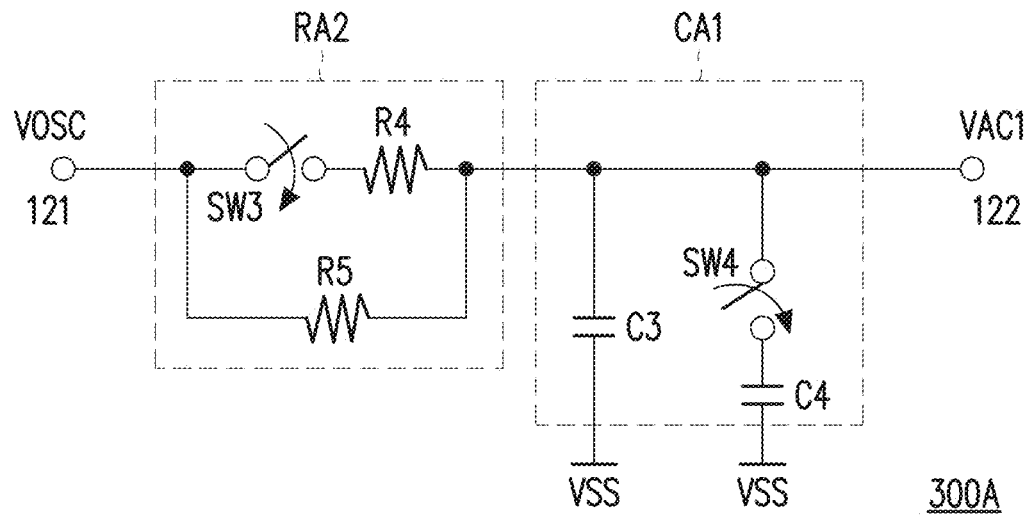
FIGS. 3A and 3B are schematic diagrams of isolation circuits, in accordance with some embodiments.
Figure 3B:
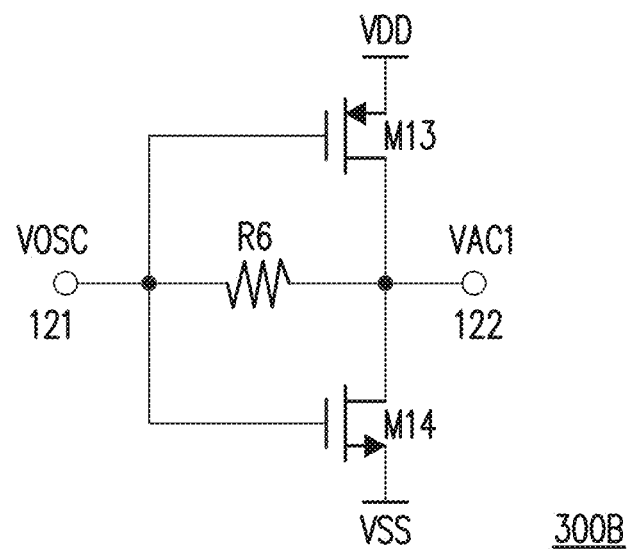

FIGS. 3A and 3B are schematic diagrams of respective isolation circuits 300A and 300B, in accordance with some embodiments. Each of isolation circuits 300A and 300B is usable as isolation circuit 120 discussed above with respect to FIGS. 1A and 1B.

Isolation circuit 300A includes input terminal 121, output terminal 122, and the power supply reference level VSS node, each discussed above with respect to FIGS. 1A and 1B, a switched resistor array RA2 coupled between input terminal 121 and output terminal 122, and a switched capacitor array CA1 coupled between output terminal 122 and the power supply reference level VSS node. Switched resistor array RA2 and switched capacitor array CA1 are thereby configured as a low-pass filter capable of generating AC signal VAC1 on output terminal 122 based on oscillation signal VOSC received at input terminal 121, as discussed above with respect to FIGS. 1A and 1B, by reducing harmonic components of oscillation signal VOSC, e.g., as provided by a ring oscillator such as oscillator 200A.

Switched resistor array RA2 includes resistive devices R4 and R5, and switching device SW3 coupled in series with resistive device R4. Resistive device R5 is configured in parallel with the series of switching device SW3 and resistive device R4. In the embodiment depicted in FIG. 3A, switched resistor array RA2 includes a total of one switching device SW3 coupled in series with resistive device R4. In various embodiments, switched resistor array RA2 does not include switching device SW3 coupled in series with resistive device R4 or includes a total of greater than one switching device SW3 coupled in series with resistive device R4.

Switched capacitor array CA1 includes capacitive devices C3 and C4, and switching device SW4 coupled in series with capacitive device C4. Capacitive device C3 is configured in parallel with the series of switching device SW4 and capacitive device C4. In the embodiment depicted in FIG. 3A, switched capacitor array CA1 includes a total of one switching device SW4 coupled in series with capacitive device C4. In various embodiments, switched capacitor array CA1 does not include switching device SW4 coupled in series with capacitive device C4 or includes a total of greater than one switching device SW4 coupled in series with capacitive device C4.

In some embodiments, control terminals of the switching devices, e.g., switching devices SW3 and SW4, are coupled to circuit elements (not shown), e.g., non-volatile memory cells, and switching devices SW3 and SW4 are thereby configured to be switched on or off responsive to a predetermined combination of power supply voltage level VDD and power supply reference level VSS, in operation. In some embodiments, control terminals of the switching devices, e.g., switching devices SW3 and SW4, are coupled to a subset of pads P1-PN and the switching devices are thereby configured to be switched on or off responsive to the one or more voltage levels discussed above with respect to FIGS. 1A and 1B.

Switched resistor array RA2 and switched capacitor array CA1 are thereby configured to, in operation, control low-pass filtering characteristics such that harmonics of oscillation signal VOSC are reduced by a predetermined amount, thus enabling tuning of isolation circuit 300A to address manufacturing process variations.

Isolation circuit 300B includes input terminal 121, output terminal 122, the power supply voltage level VDD and reference level VSS nodes, each discussed above with respect to FIGS. 1A and 1B, a resistive device R6 coupled between input terminal 121 and output terminal 122, and transistors M13 and M14 coupled between the power supply voltage level VDD and reference level VSS nodes. Transistor M13 is a PMOS transistor including a source terminal coupled to the power supply voltage level VDD node and a drain terminal coupled to output terminal 122. Transistor M14 is an NMOS transistor including a source terminal coupled to the power supply reference level VSS node and a drain terminal coupled to output terminal 122.

Isolation circuit 300B thereby includes resistive device R6 and transistors M13 and M14 arranged as an inverter, together configured as a push-pull circuit capable of isolating a circuit, e.g., oscillator 110, coupled to input terminal 121 from loading effects from a circuit, e.g., amplifier 130 and/or detection circuit 140, coupled to output terminal 122, as discussed above with respect to FIGS. 1A and 1B.

By including one of isolation circuits 300A or 300B configured to generate AC signal VAC1 based on oscillation signal VOSC, test circuit 100 is capable of realizing the benefits discussed above with respect to FIGS. 1A and 1B.

Figure 4A:
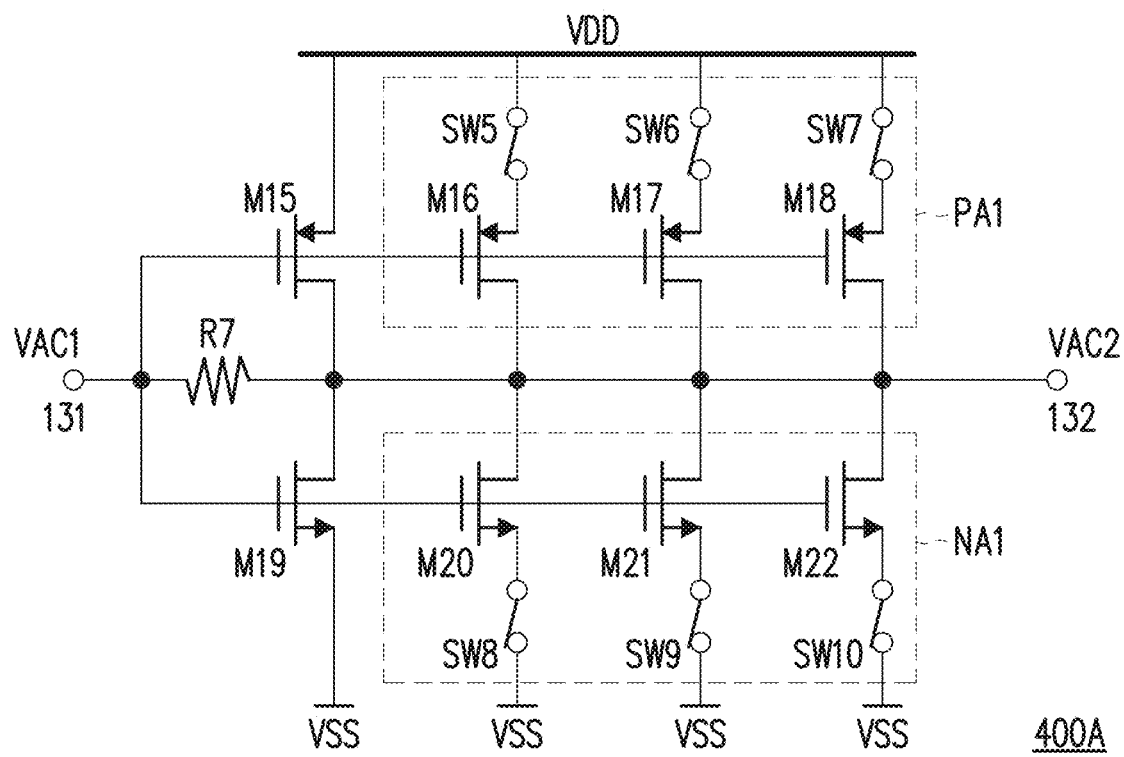
FIGS. 4A and 4B are schematic diagrams of amplifiers, in accordance with some embodiments.
Figure 4B:
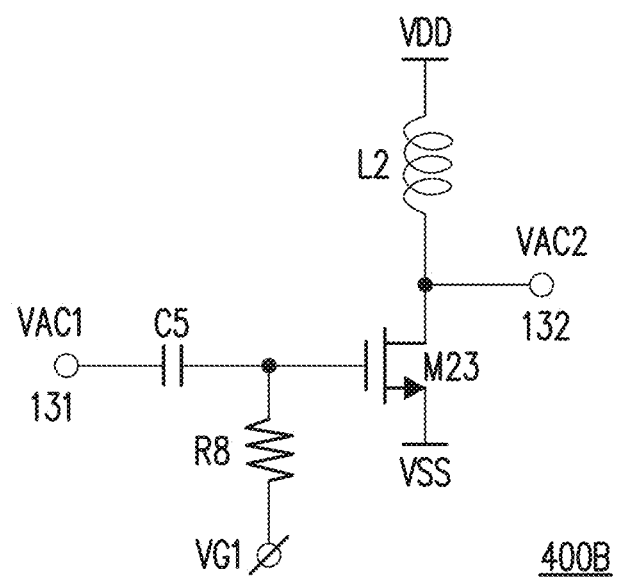

FIGS. 4A and 4B are schematic diagrams of respective amplifiers 400A and 400B, in accordance with some embodiments. Each of amplifiers 400A and 400B is usable as amplifier 130 discussed above with respect to FIGS. 1A and 1B.

Amplifier 400A includes input terminal 131, output terminal 132, the power supply voltage level VDD and reference level VSS nodes, each discussed above with respect to FIGS. 1A and 1B, a resistive device R7 coupled between input terminal 131 and output terminal 132, a transistor M15 and a switched PMOS array PA1 coupled between the power supply voltage level VDD node and output terminal 132, and a transistor M19 and a switched NMOS array NA1 coupled between output terminal 132 and the power supply reference level VSS node.

Transistor M15 is a PMOS transistor including a source terminal coupled to the power supply voltage level VDD node, a drain terminal coupled to output terminal 132, and a gate coupled to input terminal 131. Transistor M19 is an NMOS transistor including a source terminal coupled to the power supply reference level VSS node, a drain terminal coupled to output terminal 132, and a gate coupled to input terminal 131.

Amplifier 400A thereby includes resistive device R7 and transistors M15 and M19 arranged as an inverter, together configured as a push-pull circuit capable of generating AC signal VAC2 on output terminal 132 based on AC signal VAC1 received at input terminal 131 and a gain value based on conductance levels of transistors M15 and M19, as discussed above with respect to FIGS. 1A and 1B.

Switched PMOS array PA1 includes switching devices SW5-SW7 coupled in series with respective PMOS transistors M16-M18, each PMOS transistor M16-M18 being arranged in parallel with transistor M15. The switching device/transistor pairs are thereby arranged as three parallel current paths between power supply voltage level VDD node and output terminal 132 in addition to the current path provided by transistor M15. Switched NMOS array NA1 includes switching devices SW8-SW10 coupled in series with respective NMOS transistors M20-M22, each NMOS transistor M20-M22 being arranged in parallel with transistor M19. The switching device/transistor are thereby arranged as three parallel current paths between output terminal 132 and power supply reference level VSS node in addition to the current path provided by transistor M15.

Switching devices SW5-SW7 and switching devices SW8-SW10 are configured to operate synchronously such that a number of parallel paths enabled in switched PMOS array PA1 between power supply voltage level VDD node and output terminal 132 is equal to a number of parallel paths enabled in switched NMOS array NA1 between output terminal 132 and power supply reference level VSS node.

Because the gain value at which AC signal VAC2 is generated is based on the conductance levels of each of switched PMOS array PA1 and switched NMOS array NA1, amplifier 400A is thereby configured to generate AC signal VAC2 having variable gain values determined by the number of parallel paths enabled through switching devices SW5-SW7 synchronized with switching devices SW8-SW10. In operation, as the number of parallel paths increases, the conductance level, and therefore the gain value, also increases.

In the embodiment depicted in FIG. 4A, each of switched PMOS array PA1 and switched NMOS array NA1 includes a total of three switching devices, amplifier 400A thereby being configured to have four selectable gain values. In various embodiments, each of switched PMOS array PA1 and switched NMOS array NA1 includes a total of fewer or greater than three switching devices, and amplifier 400A is thereby configured to have fewer or greater than four selectable gain values.

In some embodiments, control terminals of the switching devices, e.g., switching devices SW5-SW10, are coupled to circuit elements (not shown), e.g., non-volatile memory cells, and switching devices SW5-SW10 are thereby configured to be switched on or off responsive to a predetermined combination of power supply voltage level VDD and power supply reference level VSS, in operation. In some embodiments, control terminals of the switching devices, e.g., switching devices SW5-SW10, are coupled to a subset of pads P1-PN and the switching devices are thereby configured to be switched on or off responsive to the one or more voltage levels discussed above with respect to FIGS. 1A and 1B.

In some embodiments, amplifier 400A does not include switched PMOS array PA1 and switched NMOS array NA1, and amplifier 400A has a single gain value based on the conductance levels of transistors M15 and M19.

Amplifier 400B includes input terminal 131, output terminal 132, the power supply voltage level VDD and reference level VSS nodes, each discussed above with respect to FIGS. 1A and 1B, an inductive device L2 coupled between the power supply voltage level VDD node and output terminal 132, and a transistor M23 coupled between output terminal 132 and the power supply reference level VSS node. A capacitive device C5 is coupled between a gate of transistor M23 and input terminal 131, and a resistive device R8 is coupled between the gate of transistor M23 and a node (not labeled) configured to carry a gate voltage VG1.

Amplifier 400B is thereby arranged in a common-source configuration including NMOS transistor M23 as a gain stage, capacitive device C5 as a DC block element, inductive device L2 as a load element, and resistive device R8 as a bias element. In operation, gate voltage VG1 applied to the gate of transistor M23 through resistive device R8 controls a conductance level of transistor M23, and thereby a gain of the gain stage and amplifier 400B. Amplifier 400B is thereby configured as a common-source amplifier capable of generating AC signal VAC2 on output terminal 132 based on AC signal VAC1 received at input terminal 131 and one or more gain values based on one or more values of gate voltage VG1.

In some embodiments, the gate voltage VG1 node is coupled to one or more circuit elements (not shown), e.g., a switched resistor array, and the conductance level of transistor M23 is thereby configured to be controlled responsive to one or more predetermined values of gate voltage VG1. In some embodiments, the gate voltage VG1 node is coupled to a subset of pads P1-PN and the conductance level of transistor M23 is thereby configured to be controlled responsive to the one or more voltage levels discussed above with respect to FIGS. 1A and 1B.

By including one of amplifiers 400A or 400B configured to generate AC signal VAC2 based on AC signal VAC1, test circuit 100 is capable of realizing the benefits discussed above with respect to FIGS. 1A and 1B.

Figure 5A:
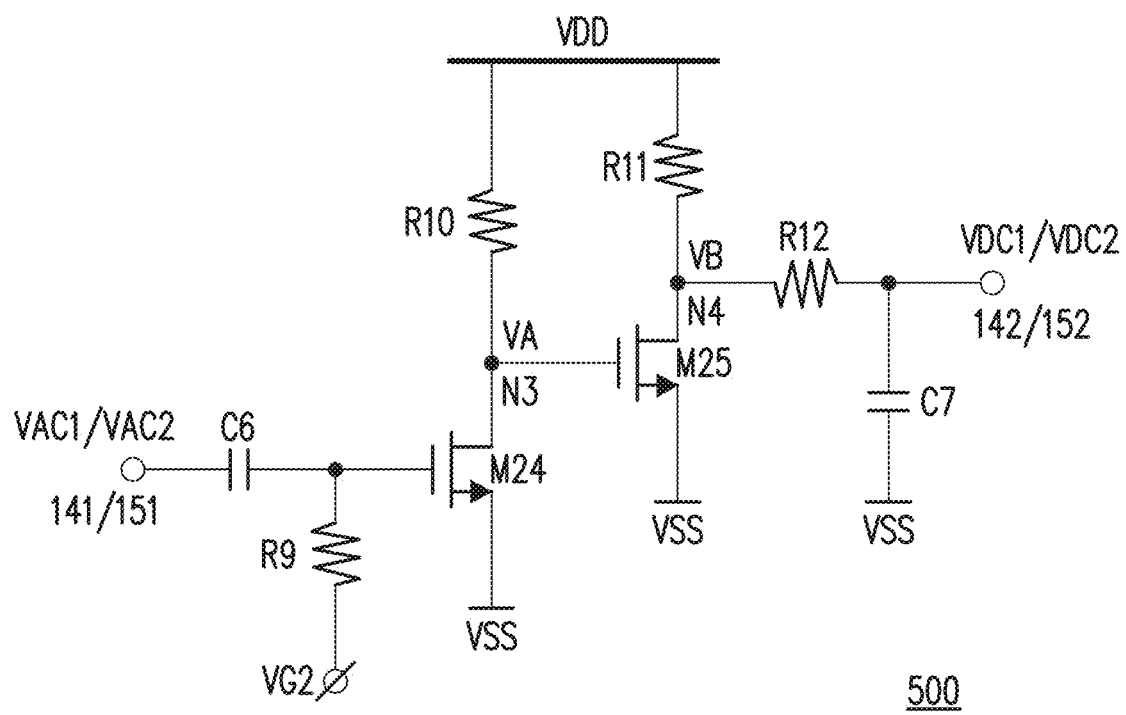
FIG. 5A is a schematic diagram of a detection circuit, in accordance with some embodiments.
Figure 5B:
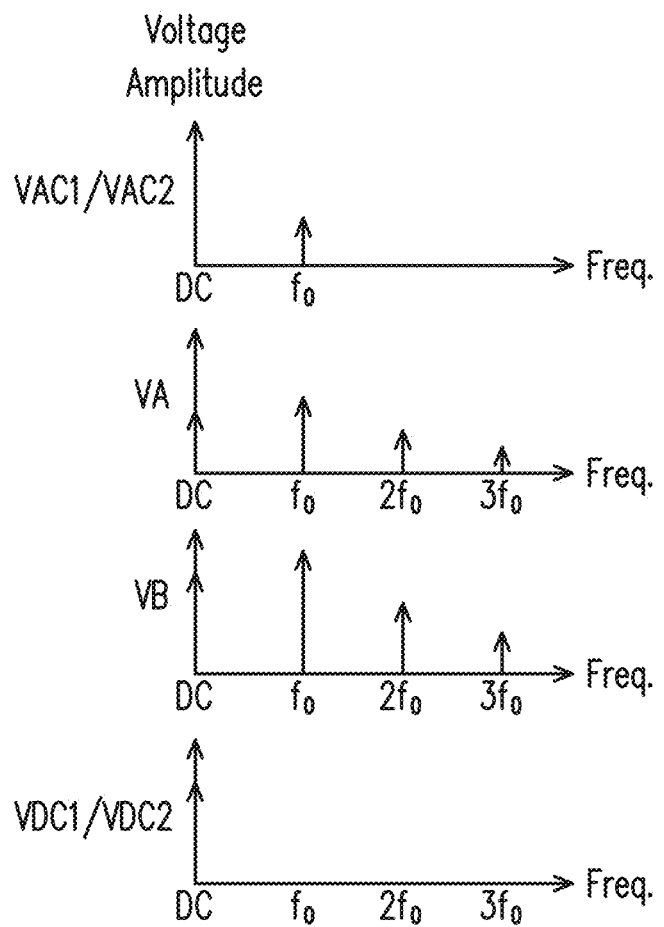
FIG. 5B is a depiction of detection circuit parameters, in accordance with some embodiments.

FIG. 5A is a schematic diagram of a detection circuit 500, in accordance with some embodiments, and FIG. 5B is a depiction of detection circuit 500 parameters, in accordance with some embodiments. Detection circuit 500 is usable as one or both of detection circuits 140 or 150 discussed above with respect to FIGS. 1A and 1B.

Detection circuit 500 includes an input terminal 141/151 usable as either of input terminals 141 or 151, an output terminal 142/152 usable as either of output terminals 142 or 152, and the power supply voltage level VDD and reference level VSS nodes, each discussed above with respect to FIGS. 1A and 1B. Detection circuit 500 includes a resistive device R10 coupled through a node N3 to a transistor M24, the series coupled between the power supply voltage level VDD and reference level VSS nodes, and a resistive device R11 coupled through a node N4 to a transistor M25, the series coupled between the power supply voltage level VDD and reference level VSS nodes. A capacitive device C6 is coupled between a gate of transistor M24 and input terminal 141/151, and a resistive device R9 is coupled between the gate of transistor M24 and a node (not labeled) configured to carry a gate voltage VG2. A resistive device R12 is coupled between node N4 and output terminal 142/152, and a capacitive device C7 is coupled between output terminal 142/152 and the power supply reference level VSS node.

Resistive device R10, transistor M24, capacitive device C6, and resistive device R9 are thereby arranged in a common-source configuration including NMOS transistor M24 as a first gain stage, capacitive device C6 as a DC block element, resistive device R10 as a load element, resistive device R9 as a bias element, and node 3 as an output node. Resistive device R11 and transistor M25 are thereby arranged in a common-source configuration including NMOS transistor M25 as a second gain stage in a cascade arrangement with the first gain stage, and node N4 as an output node. Resistive device R12 and capacitive device C7 are thereby arranged in a low-pass filter configuration including node N4 as an input node and output terminal 142/152.

In operation, gate voltage VG2 applied to the gate of transistor M24 through resistive device R9 controls a conductance level of transistor M24, and thereby a gain value of the first gain stage, such that a signal VA is generated on node N3 based on the gain value and either of signals VAC1 or VAC2 discussed above with respect to FIGS. 1A and 1B (represented in FIGS. 5A and 5B as a signal VAC1/VAC2) received at input terminal 141/151.

In operation, the second gain stage generates a signal VB on node N4 based on signal VA and having a DC component that varies with the amplitude of signal VAC1/VAC2. The DC variation is based on a polarity of coefficients of even numbered harmonics of signal VAC1/VAC2 as amplified by the first and second stages. In some embodiments, the coefficients are positive and the DC component of signal VB decreases with increasing VAC1/VAC2 amplitude. In some embodiments, the coefficients are negative and the DC component of signal VB increases with increasing VAC1/VAC2 amplitude. In various embodiments, the polarity of the coefficients is a function of one or both of a frequency of signal VAC1/VAC2 or a gain value of the first gain stage based on a value of gate voltage VG2.

In operation, the low-pass filter including resistive device R12 and capacitive device C7 receives signal VB at node N4, and generates a corresponding one of signals VDC1 or VDC2 discussed above with respect to FIGS. 1A and 1B (represented in FIGS. 5A and 5B as a signal VDC1/VDC2) on output terminal 142/152 by attenuating the AC components of signal VB. In various embodiments, detection circuit 500 includes an arrangement other than that depicted in FIG. 5A and/or includes one or more circuit components (not shown) in addition to resistive device R12 and capacitive device C7 and thereby includes a low-pass filter configured to attenuate the AC components of signal VB.

Detection circuit 500 is thereby configured to receive one of signals VAC1 or VAC2 at a corresponding input terminal 141 or 151, and generate a corresponding one of signals VDC1 or VDC2 at a corresponding output terminal 142 or 152 and having an amplitude that varies with an amplitude of the corresponding signal VAC1 or VAC2. By the configuration discussed above, the amplitude of signal VDC1 or VDC2 either decreases or increases with increasing amplitude of the corresponding signal VAC1 or VAC2. In various embodiments, a relationship between the amplitudes of signal VDC1 or VDC2 and corresponding signal VAC1 or VAC2 varies as a function of a frequency of the corresponding signal VAC1 or VAC2 and/or as a function of a value of gate voltage VG2.

In some embodiments, the gate voltage VG2 node is coupled to one or more circuit elements (not shown), e.g., a switched resistor array, and the gain value of the first stage including transistor M24 is thereby configured to be controlled responsive to one or more predetermined values of gate voltage VG2. In some embodiments, the gate voltage VG2 node is coupled to a subset of pads P1-PN and the gain value of the first stage including transistor M24 is thereby configured to be controlled responsive to the one or more voltage levels discussed above with respect to FIGS. 1A and 1B.

FIG. 5B depicts a non-limiting example of signals VAC1/VAC2, VA, VB, and VDC1/VDC2 of detection circuit 500, in accordance with some embodiments. Signal VAC1/VAC2, received at input terminal 141/151, is represented as an AC signal having a single frequency component at frequency f0. Signal VA, generated at node N3 by the first stage, includes DC component, a first component at frequency f0, a second component at frequency 2f0, and a third component at frequency 3f0. Each of the second component at frequency 2f0, an even harmonic of frequency f0, and the third component at frequency 3f0, an odd harmonic of frequency f0, has a positive coefficient.

Signal VB, generated at node N4 by the second stage, includes a DC component, a first component at frequency f0, a second component at frequency 2f0, and a third component at frequency 3f0. Each of the second component at frequency 2f0, an even harmonic of frequency f0, and the third component at frequency 3f0, an odd harmonic of frequency f0, has a positive coefficient.

Signal VDC1/VDC2, generated at output terminal 142/152, is represented as a DC signal with no significant AC signal components. An amplitude of DC signal VDC1/VDC2 is based on an amplitude of AC signal VAC1/VAC2 at frequency f0. In the non-limiting example depicted in FIG. 5B, based on the positive coefficient of the second component of signal VB at frequency 2f0, the amplitude of signal VDC1/VDC2 decreases as a function of an increase in the amplitude of signal VAC1/VAC2 such that the amplitude of signal VDC1/VDC2 is usable to determine the amplitude of signal VAC1/VAC2.

By including detection circuit 500 configured to generate a DC signal, e.g., DC signal VDC1 or VDC2, based on an AC signal, e.g., AC signal VAC1 or VAC2, a test circuit, e.g., test circuit 100, is capable of realizing the benefits discussed above with respect to FIGS. 1A and 1B.

Figure 6A:
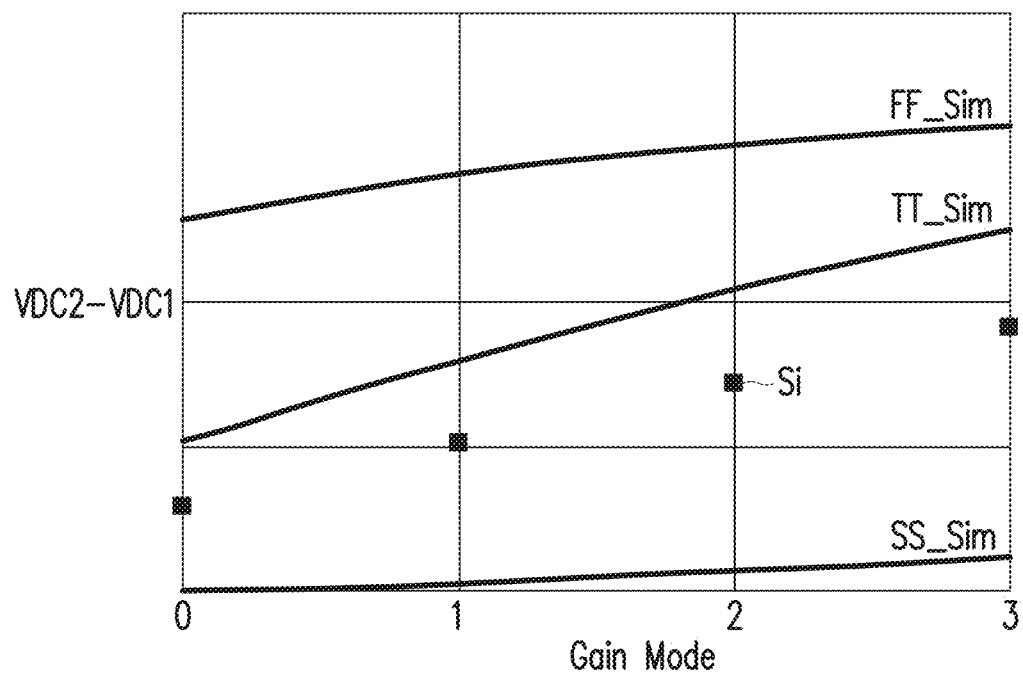
FIGS. 6A and 6B are depictions of test circuit parameters, in accordance with some embodiments.
Figure 6B:
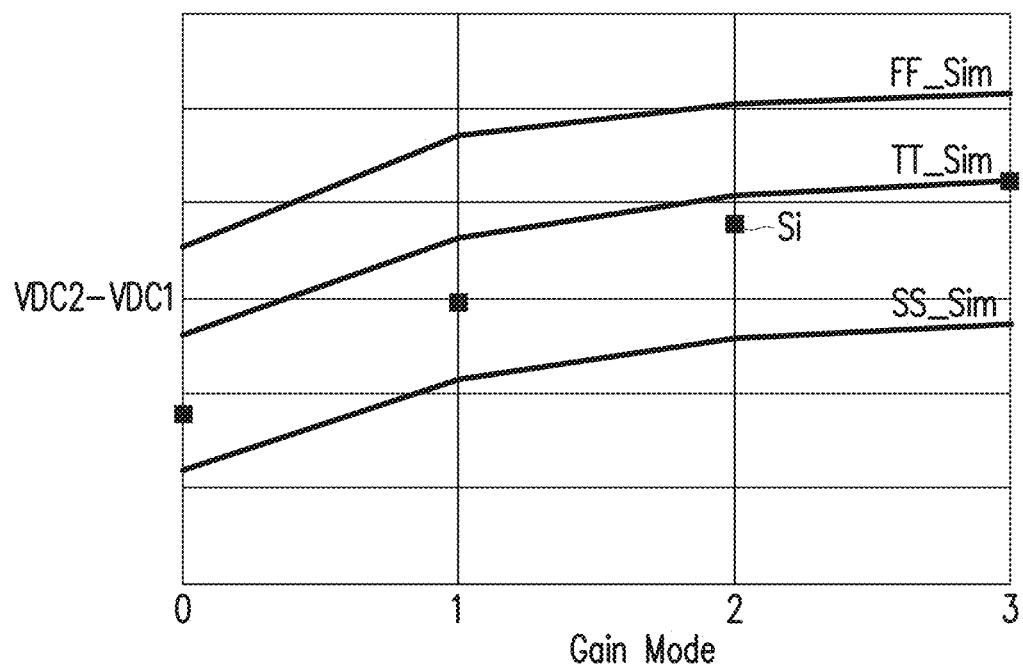

FIGS. 6A and 6B are depictions of test circuit 100 parameters, in accordance with some embodiments. Each of FIGS. 6A and 6B includes plots of simulated and measured gain values for each of four gain settings, with gain represented as a difference in DC signal amplitudes, VCD2-VDC1. For each gain setting, or mode, 0-3, a measured gain value Si is plotted along with simulated gain values for each of a fast manufacturing process corner, FF_Sim, a typical manufacturing process corner, TT_Sim, and a slow manufacturing process corner, SS_Sim.

In the non-limiting example depicted in FIG. 6A, test circuit 100 includes oscillator 200A configured to generate oscillation signal VOSC having a frequency of 4 GHz, isolation circuit 300A, and amplifier 400A. Gain modes 0-3 correspond to the number of enabled current paths of switched PMOS array PA1 and switched NMOS array NA1 of amplifier 400A. As indicated in FIG. 6A, the measured gain value Si for each gain mode is between the TT_Sim and SS_Sim gain values.

In the non-limiting example depicted in FIG. 6B, test circuit 100 includes oscillator 200B configured to generate oscillation signal VOSC having a frequency of 60 GHz, isolation circuit 300B, and amplifier 400B. Gain modes 0-3 correspond to values of gate voltage VG1 applied to the gate of transistor M23 of amplifier 400B. As indicated in FIG. 6B, the measured gain value Si for each gain mode is between the TT_Sim and SS_Sim gain values.

Figure 7:
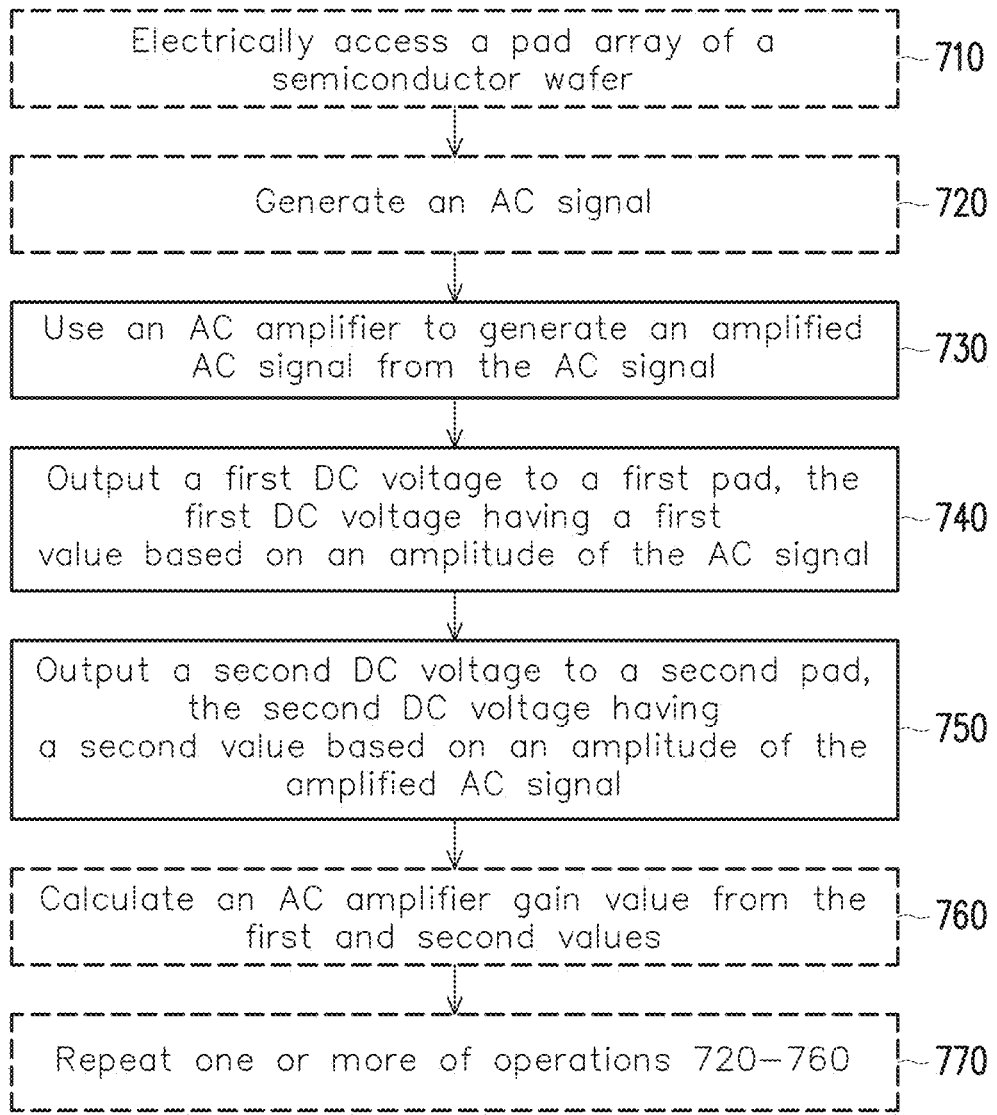
FIG. 7 is a flowchart of a method of measuring an AC amplifier gain, in accordance with some embodiments.

FIG. 7 is a flow chart of a method 700 of measuring an AC amplifier gain. Method 700 is capable of being performed with a test circuit, e.g., test circuit 100, discussed above with respect to FIGS. 1A and 1B.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, some or all of the operations of method 700 are part of performing a DC test, e.g., a WAT, operation.

At operation 710, in some embodiments, a pad array of a semiconductor wafer is electrically accessed. Electrically accessing the pad array includes contacting the pad array with a set of probe pins configured to have a given probe pin make an electrical connection with a corresponding pad of the pad array. In some embodiments, electrically accessing the pad array includes electrically accessing the pad array in one or more scribe lines of the semiconductor wafer. In some embodiments, electrically accessing the pad array includes electrically accessing pads P1-PN discussed above with respect to FIGS. 1A and 1B.

In some embodiments, electrically accessing the pad array includes performing an automated DC test, e.g., a WAT, operation by controlling movement of the semiconductor wafer using an automated test system. In some embodiments, electrically accessing the pad array of the semiconductor wafer includes executing one or more software routines on the automated test system. In some embodiments, electrically accessing the pad array of the semiconductor wafer includes electrically accessing one pad array of a plurality of pad arrays of the semiconductor wafer. In some embodiments, electrically accessing the pad array of the semiconductor wafer includes electrically accessing a number of pad arrays of the semiconductor wafer ranging from four to ten.

In some embodiments, electrically accessing the pad array of the semiconductor wafer includes electrically accessing the pad array of one semiconductor wafer of a plurality of semiconductor wafers. In some embodiments, electrically accessing the pad array of the semiconductor wafer includes electrically accessing the pad arrays of a number of semiconductor wafers ranging from 20 to 30.

At operation 720, in some embodiments, an AC signal is generated. In some embodiments, generating the AC signal includes generating an RF signal having a frequency ranging from about 10 MHz to about 100 GHz. Generating the AC signal includes using an oscillator to generate an oscillator signal. In various embodiments, using the oscillator includes generating oscillator signal VOSC using oscillator 110 discussed above with respect to FIGS. 1A and 1B, oscillator 200A discussed above with respect to FIG. 2A, or oscillator 200B discussed above with respect to FIG. 2B.

In some embodiments, generating the AC signal includes using an isolation circuit to generate the AC signal based on the oscillator signal. In various embodiments, using the isolation circuit includes generating AC signal VAC1 based on oscillator signal VOSC using isolation circuit 120 discussed above with respect to FIGS. 1A and 1B, isolation circuit 300A discussed above with respect to FIG. 3A, or isolation circuit 300B discussed above with respect to FIG. 3B.

In some embodiments, generating the AC signal includes providing a plurality of DC voltage levels to the pad array. In some embodiments, generating the AC signal includes setting a frequency of the AC signal by providing one or more DC voltage levels of the plurality of DC voltage levels to the pad array. In some embodiments, providing the plurality of DC voltage levels to the pad array includes providing the one or more voltage levels and the reference voltage level to pads P1-PN, as discussed above with respect to FIGS. 1A and 1B.

In some embodiments, providing the plurality of DC voltage levels to the pad array includes obtaining the plurality of DC voltage levels from a storage device using the automated test system.

At operation 730, an AC amplifier is used to generate an amplified AC signal from the AC signal. In various embodiments, generating the amplified AC signal from the AC signal includes generating AC signal VAC2 from AC signal VAC1 using amplifier 130 discussed above with respect to FIGS. 1A and 1B, amplifier 400A discussed above with respect to FIG. 4A, or amplifier 400B discussed above with respect to FIG. 4B.

Generating the amplified AC signal from the AC signal includes providing a plurality of DC voltage levels to the amplifier. In some embodiments, providing the plurality of DC voltage levels to the amplifier includes providing one or more of the one or more voltage levels and the reference voltage level to pads P1-PN, as discussed above with respect to FIGS. 1A and 1B.

In some embodiments, generating the amplified AC signal from the AC signal includes using the amplifier having a predetermined gain setting. In some embodiments, generating the amplified AC signal from the AC signal includes setting a gain value of the amplifier. In some embodiments, setting the gain value includes setting switches SW5-SW10 of amplifier 400A discussed above with respect to FIG. 4A. In some embodiments, setting the gain value includes providing gate voltage VG1 to amplifier 400B discussed above with respect to FIG. 4B.

In some embodiments, setting the gain value includes providing a plurality of DC voltage levels to the pad array. In some embodiments, providing the plurality of DC voltage levels to the pad array includes providing one or more of the one or more voltage levels and the reference voltage level to pads P1-PN, as discussed above with respect to FIGS. 1A and 1B. In some embodiments, providing the plurality of DC voltage levels to the pad array includes obtaining the plurality of DC voltage levels from a storage device using the automated test system.

At operation 740, a first DC voltage is output to a first pad, the first DC voltage having a first value based on an amplitude of the AC signal. In some embodiments, outputting the first DC voltage to the first pad includes outputting signal VDC1 to one of pads P1-PN discussed above with respect to FIGS. 1A and 1B.

Outputting the first DC voltage includes outputting the first DC voltage using a detection circuit. In various embodiments, outputting the first DC voltage includes outputting DC signal VDC1 using detection circuit 140 discussed above with respect to FIGS. 1A and 1B or detection circuit 500 discussed above with respect to FIGS. 5A and 5B.

Outputting the first DC voltage includes providing a plurality of DC voltage levels to the detection circuit. In some embodiments, providing the plurality of DC voltage levels to the detection circuit includes providing one or more of the one or more voltage levels and the reference voltage level to pads P1-PN, as discussed above with respect to FIGS. 1A and 1B.

In some embodiments, outputting the first DC voltage having the first value based on an amplitude of the AC signal includes setting a gain value of the detection circuit. In some embodiments, setting the gain value includes providing a plurality of DC voltage levels to the pad array. In some embodiments, providing the plurality of DC voltage levels to the pad array includes providing one or more of the one or more voltage levels and the reference voltage level to pads P1-PN, as discussed above with respect to FIGS. 1A and 1B. In some embodiments, providing the plurality of DC voltage levels to the pad array includes obtaining the plurality of DC voltage levels from a storage device using the automated test system.

In some embodiments, outputting the first DC voltage includes using the automated test system to store the first DC voltage in a storage device.

At operation 750, a second DC voltage is output to a second pad, the second DC voltage having a second value based on an amplitude of the amplified AC signal. Outputting the second DC voltage to the second pad, the second DC voltage having a second value based on an amplitude of the amplified AC signal, is analogous to outputting the first DC voltage to the first pad, the first DC voltage having a first value based on an amplitude of the AC signal, as discussed above with respect to operation 740, and a detailed description thereof is not repeated.

At operation 760, in some embodiments, an AC amplifier gain value is calculated from the first and second values. In some embodiments, calculating the AC amplifier gain value includes calculating a ratio of the amplitude of the amplifier AC signal to the amplitude of the AC signal.

In some embodiments, calculating the AC amplifier gain value includes subtracting the first value from the second value. In some embodiments, calculating the AC amplifier gain value includes comparing the calculated AC amplifier gain value to a predetermined threshold value. In some embodiments, calculating the AC amplifier gain value includes using the automated test system to store the calculated gain value in a storage device.

At operation 770, in some embodiments, one or more of operations 720-760 is repeated. In various embodiments, repeating one or more of operations 720-760 includes altering one or more of a frequency setting of an oscillator, a gain setting of an amplifier, or a gain setting of a detection circuit.

By executing some or all of the operations of method 700, DC test pads and equipment are used to obtain DC signals output by a test circuit and having amplitudes usable for determining a gain value of an AC signal amplifier, thereby obtaining the benefits discussed above with respect to test circuit 100 and FIGS. 1A and 1B.

In some embodiments, an IC includes a plurality of pads at a top surface of a semiconductor wafer, an amplifier configured to receive a first AC signal at an input terminal, and output a second AC signal at an output terminal, a first detection circuit coupled to the input terminal and configured to output a first DC voltage to a first pad of the plurality of pads responsive to the first AC signal, and a second detection circuit coupled to the output terminal and configured to output a second DC voltage to a second pad of the plurality of pads responsive to the second AC signal.

In some embodiments, an IC includes a plurality of pads at a top surface of a semiconductor wafer, an amplifier configured to receive a first AC signal at an input terminal, and output a second AC signal at an output terminal, a first detection circuit coupled to the input terminal and configured to output a first DC voltage to a first pad of the plurality of pads responsive to the first AC signal, and a second detection circuit coupled to the output terminal and configured to output a second DC voltage to a second pad of the plurality of pads responsive to the second AC signal. Each of the amplifier and the first and second detection circuits is configured to have a gain controllable based on one or more voltage levels received at the plurality of pads.

In some embodiments, a method of testing an IC includes electrically accessing a pad array at a top surface of a semiconductor wafer, receiving a first AC signal at an input terminal of an amplifier of the IC, outputting a second AC signal at an output terminal of the amplifier, in response to the first AC signal, using a first detection circuit of the IC to output a first DC voltage to a first pad of the pad array, and in response to the second AC signal, using a second detection circuit of the IC to output a second DC voltage to a second pad of the pad array.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) comprising:
   a plurality of pads at a top surface of a semiconductor wafer;
   an amplifier configured to receive a first alternating current (AC) signal at an input terminal, and output a second AC signal at an output terminal;
   a first detection circuit coupled to the input terminal and configured to output a first direct current (DC) voltage to a first pad of the plurality of pads responsive to the first AC signal; and
   a second detection circuit coupled to the output terminal and configured to output a second DC voltage to a second pad of the plurality of pads responsive to the second AC signal.

2. The IC of claim 1, wherein each of the plurality of pads, the amplifier, and the first and second detection circuits is located in a scribe line adjacent to a product die of the semiconductor wafer.

3. The IC of claim 1, wherein each of the plurality of pads, the amplifier, and the first and second detection circuits is located in a test die of the semiconductor wafer.

4. The IC of claim 1, further comprising an oscillator coupled in series with an isolation circuit, wherein
   the oscillator is configured to output an oscillation signal to the isolation circuit, and
   an output terminal of the isolation circuit is coupled to the input terminal of the amplifier.

5. The IC of claim 4, wherein
   each of the first and second AC signals has a frequency of the oscillation signal, and
   the oscillator is configured to generate the oscillation signal having the frequency ranging from about 10 megahertz (MHz) to about 100 gigahertz (GHz).

6. The IC of claim 1, wherein the first and second detection circuits are configured to output the corresponding first and second DC voltages having a voltage difference corresponding to a gain of the amplifier.

7. The IC of claim 1, wherein each of the first and second detection circuits comprises:
   a first gain stage comprising a first resistive device coupled in series with a first transistor, wherein a gate of the first transistor is capacitively coupled to an input terminal of the corresponding first or second detection circuit;
   a second gain stage comprising a second resistive device coupled in series with a second transistor, wherein a gate of the second transistor is coupled to an output node of the first gain stage; and
   a low pass filter coupled between an output node of the second gain stage and the corresponding first or second pad of the plurality of pads.

8. An integrated circuit (IC) comprising:
   a plurality of pads at a top surface of a semiconductor wafer;
   an amplifier configured to receive a first alternating current (AC) signal at an input terminal, and output a second AC signal at an output terminal;
   a first detection circuit coupled to the input terminal and configured to output a first direct current (DC) voltage to a first pad of the plurality of pads responsive to the first AC signal; and
   a second detection circuit coupled to the output terminal and configured to output a second DC voltage to a second pad of the plurality of pads responsive to the second AC signal,
   wherein each of the amplifier and the first and second detection circuits is configured to have a gain controllable based on one or more voltage levels received at the plurality of pads.

9. The IC of claim 8, wherein each of the plurality of pads, the amplifier, and the first and second detection circuits is located either in a scribe line adjacent to a product die of the semiconductor wafer or in a test die of the semiconductor wafer.

10. The IC of claim 8, wherein the first and second AC signals are configured to have a frequency ranging from about 10 megahertz (MHz) to about 100 gigahertz (GHz).

11. The IC of claim 8, wherein the first and second detection circuits are configured to output the corresponding first and second DC voltages having a voltage difference corresponding to the gain of the amplifier.

12. The IC of claim 8, wherein each of the first and second detection circuits comprises:
    a first gain stage comprising a first resistive device coupled in series with a first transistor;
    a second gain stage comprising a second resistive device coupled in series with a second transistor, wherein a gate of the second transistor is coupled to an output node of the first gain stage; and
    a low pass filter coupled between an output node of the second gain stage and the corresponding first or second pad of the plurality of pads.

13. The IC of claim 12, wherein
    each of the first and second detection circuits further comprises:

a capacitive device coupled between a gate of the first transistor and the corresponding input or output terminal of the amplifier; and a resistive device coupled between the gate of the first transistor and a corresponding third or fourth pad of the plurality of pads, and a gain level of the first gain stage is based on a conductance level of the first transistor controllable by a voltage level of the one or more voltage levels received at the corresponding third or fourth pad of the plurality of pads.

14. The IC of claim 12, wherein the low pass filter comprises:

a third resistive device coupled between the output node of the second gain stage and the corresponding first or second pad of the plurality of pads; and a capacitive device coupled between the corresponding first or second pad of the plurality of pads and a node configured to have a power supply reference level.

15. A method of testing an integrated current (IC), the method comprising:

electrically accessing a pad array at a top surface of a semiconductor wafer;

receiving a first alternating current (AC) signal at an input terminal of an amplifier of the IC;

outputting a second AC signal at an output terminal of the amplifier;

in response to the first AC signal, using a first detection circuit of the IC to output a first direct current (DC) voltage to a first pad of the pad array; and in response to the second AC signal, using a second detection circuit of the IC to output a second DC voltage to a second pad of the pad array.

16. The method of claim 15, wherein the electrically accessing the pad array at the top surface of the semiconductor wafer comprises using a set of probe pins to contact the pad array located either in a scribe line adjacent to a product die of the semiconductor wafer or in a test die of the semiconductor wafer.

17. The method of claim 15, wherein each of the receiving the first AC signal and the outputting the second AC signal comprises the corresponding first or second AC signal having a frequency ranging from about 10 megahertz (MHz) to about 100 gigahertz (GHz).

18. The method of claim 15, wherein the using the first detection circuit of the IC to output the first DC voltage comprises receiving the first AC signal at a first capacitive device of the first detection circuit, and the using the second detection circuit of the IC to output the second DC voltage comprises receiving the second AC signal at a second capacitive device of the second detection circuit.

19. The method of claim 15, wherein the using the first detection circuit of the IC to output the first DC voltage comprises controlling a gain of the first detection circuit based on a first voltage level received at a third pad of the pad array, and the using the second detection circuit of the IC to output the second DC voltage comprises controlling a gain of the second detection circuit based on a second voltage level received at a fourth pad of the pad array.

20. The method of claim 15, wherein the semiconductor wafer is a first semiconductor wafer of a plurality of semiconductor wafers, each semiconductor wafer of the plurality of semiconductor wafers comprising a corresponding pad array at a corresponding top surface, and the electrically accessing the pad array at the top surface of the semiconductor wafer comprises electrically accessing each pad array of each semiconductor wafer of the plurality of semiconductor wafers.

\* \* \* \* \*